(12) United States Patent
Zhang et al.

(10) Patent No.: US 11,296,151 B2
(45) Date of Patent: Apr. 5, 2022

(54) DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventors: Ming Zhang, Wuhan (CN); Jie Yang, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 353 days.

(21) Appl. No.: 16/623,079

(22) PCT Filed: Sep. 17, 2019

(86) PCT No.: PCT/CN2019/106079
§ 371 (c)(1),
(2) Date: Dec. 16, 2019

(87) PCT Pub. No.: WO2020/228209
PCT Pub. Date: Nov. 19, 2020

(65) Prior Publication Data
US 2021/0335913 A1 Oct. 28, 2021

(30) Foreign Application Priority Data

May 15, 2019 (CN) .......................... 201910406243.8

(51) Int. Cl.
*H01L 27/32* (2006.01)
*H01L 51/52* (2006.01)

(52) U.S. Cl.
CPC ...... *H01L 27/3218* (2013.01); *H01L 27/3234* (2013.01); *H01L 27/3262* (2013.01); *H01L 51/5234* (2013.01); *H01L 2251/308* (2013.01)

(58) Field of Classification Search
CPC ............. H01L 27/3218; H01L 27/3234; H01L 27/3262; H01L 51/5234; H01L 2251/308;
(Continued)

(56) References Cited

U.S. PATENT DOCUMENTS

2011/0012816 A1  1/2011  Kang et al.
2011/0122344 A1  5/2011  Matsumuro et al.
(Continued)

FOREIGN PATENT DOCUMENTS

CN  101128939 A  2/2008
CN  101958340 A  1/2011
(Continued)

*Primary Examiner* — Selim U Ahmed
(74) *Attorney, Agent, or Firm* — Osha Bergman Watanabe & Burton LLP

(57) ABSTRACT

A display panel is provided, including a transparent display area and a conventional display area surrounding the transparent display area. The transparent display area and the conventional display area both include a plurality of sub-pixel units, and a density of sub-pixel units in the transparent display area is the same as a density of sub-pixel units in the conventional display area. A pixel area of the sub-pixel units in the transparent display area is less than a pixel area of the sub-pixel units in the conventional display area.

20 Claims, 3 Drawing Sheets

(58) Field of Classification Search
CPC ............... H01L 27/3216; H01L 27/326; H01L 27/3246
See application file for complete search history.

(56) References Cited

U.S. PATENT DOCUMENTS

| | | |
|---|---|---|
| 2011/0175097 A1 | 7/2011 | Song et al. |
| 2016/0276615 A1 | 9/2016 | Kitabayashi |
| 2017/0277314 A1 | 9/2017 | Chen et al. |
| 2019/0206953 A1 | 7/2019 | Hsieh et al. |
| 2020/0127061 A1* | 4/2020 | Zou ....................... H01L 27/326 |

FOREIGN PATENT DOCUMENTS

| | | |
|---|---|---|
| CN | 102084412 A | 6/2011 |
| CN | 206451466 U | 8/2017 |
| CN | 107229360 A | 10/2017 |
| CN | 108766990 A | 11/2018 |
| CN | 108922900 A | 11/2018 |
| CN | 109285860 A | 1/2019 |
| CN | 109300951 A | 2/2019 |
| CN | 109697396 A | 4/2019 |
| CN | 110098238 A | 8/2019 |

\* cited by examiner

DISPLAY PANEL

FIELD OF DISCLOSURE

The present disclosure relates to the field of display technologies, and in particular, to a display panel and a display device with a high light transmittance of a transparent display area.

BACKGROUND

Organic light-emitting diodes (OLEDs) have advantages of self-illumination, high contrast, wide viewing angles, low power consumption, and flexibility, so they are popular among people and developers. Flexible OLED is gradually occupying a market due to its remarkable resistance against bending force and thinness. On this basis, a display device with a high screen-to-body ratio and a full-screen has also become focus of development and research and development trends of market.

Taking a display panel of a mobile phone as an example, increasing a screen-to-body ratio of the display panel of the mobile phone and an aesthetic appearance of the mobile phone have become a mainstream design of a screen of the mobile phone. However, in addition to a display function of the screen of the mobile phone, components such as a camera, a handset, and a microphone may also affect the screen-to-body ratio and the aesthetic appearance of the mobile phone.

Therefore, a technology of a under-screen camera that designs a transparent display area on the display panel and sets a camera component below the transparent display area has become main a technical means for improving the screen-to-body ratio of the display panel and realizing a full-screen. However, if the camera component is placed below the display panel, a camera function and a light capture capability the camera component will be affected by the display panel. In order to improve the light capturing capability and imaging quality performance of the under-screen camera, it is necessary to increase a light transmittance of an ambient light passing through the transparent display area.

SUMMARY OF DISCLOSURE

Currently, in the prior art, a technical solution for reducing a pixel density is often used to improve a light transmittance of a transparent display area. The above technical solution can achieve the purpose of improving the light transmittance and improving imaging quality performance of a camera, but it will affect display quality performance of the transparent display area, causing a large difference on display and uneven display. Moreover, due to the different pixel densities of the transparent display area and a conventional display area, a fine metal mask (FMM) is difficult to manufacture, and the display panel has a higher production cost.

Therefore, it is necessary to provide a display panel with a high transmittance of a transparent display area to solve the above technical problems.

An object of the present disclosure is to solve the above technical problems, and to provide a display panel having a high light transmittance of a transparent display area and a display device using the display panel.

In order to achieve the above object, the present disclosure adopts following technical solutions.

A display panel includes a transparent display area and a conventional display area surrounding the transparent display area. The transparent display area and the conventional display area both include a plurality of sub-pixel units, and a density of sub-pixel units in the transparent display area is the same as a density of sub-pixel units in the conventional display area. A pixel area of the sub-pixel units in the transparent display area is less than a pixel area of the sub-pixel units in the conventional display area. The display panel includes a substrate, a thin film transistor (TFT) circuit, a plurality of sub-pixel electrodes, and a photo spacer layer, and the TFT circuit, the sub-pixel electrodes, and the photo spacer layer are sequentially disposed on the substrate. The TFT circuit includes a plurality of metal traces. The photo spacer layer includes a plurality of openings, and one of the openings correspondingly exposes one of the sub-pixel electrodes. A width of one of the openings of the photo spacer layer in the transparent display area is less than a width of one of the openings of the photo spacer layer in the conventional display area.

Furthermore, an orthographic projection of a first electrode in the transparent display area on the substrate completely covers the TFT circuit.

Furthermore, a portion of the metal traces of the TFT circuit in the transparent display area is made of a transparent electrode material, and the portion is beyond a first electrode.

Furthermore, the width of the one of the openings of the photo spacer layer in the transparent display area is 0.5 to 0.8 times the width of the one of the openings of the photo spacer layer in the conventional display area.

A display panel includes a transparent display area and a conventional display area surrounding the transparent display area. The transparent display area and the conventional display area both include a plurality of sub-pixel units, and a density of sub-pixel units in the transparent display area is the same as a density of sub-pixel units in the conventional display area. A pixel area of the sub-pixel units in the transparent display area is less than a pixel area of the sub-pixel units in the conventional display area.

Furthermore, the display panel includes a substrate, a thin film transistor (TFT) circuit, a plurality of first electrodes, and a photo spacer layer, and the TFT circuit, the first electrodes, and the photo spacer layer are sequentially disposed on the substrate, and the TFT circuit TFT circuit includes a plurality of metal traces.

Furthermore, the photo spacer layer includes a plurality of openings, and one of the openings correspondingly exposes one of the first electrodes.

Furthermore, the photo spacer layer is composed of one or more layers of polyacrylate and polyimide.

Furthermore, a width of one of the openings of the photo spacer layer in the transparent display area is less than a width of one of the openings of the photo spacer layer in the conventional display area.

Furthermore, the width of the one of the openings of the photo spacer layer in the transparent display area is 0.5 to 0.8 times the width of the one of the openings of the photo spacer layer in the conventional display area.

Furthermore, an orthographic projection of one of the first electrodes in the transparent display area on the substrate completely covers the TFT circuit.

Furthermore, a portion of the metal traces of the TFT circuit in the transparent display area is made of a transparent electrode material.

Furthermore, a portion of the metal traces of the TFT circuit in the transparent display area is made of a transparent electrode material, and the portion is beyond one of the first electrodes.

Furthermore, the first electrodes are a plurality of sub-pixel electrodes.

Furthermore, the TFT circuit includes a first buffer layer, a second buffer layer, an active layer, a gate insulating layer, a gate, an interlayer dielectric layer, a source, a drain, and a planarization layer which are sequentially disposed on the substrate.

Furthermore, the transparent display area and the conventional display area both include one or more of red (R) sub-pixel units, green (G) sub-pixel units, and blue (B) sub-pixel units.

Furthermore, the R sub-pixel units, the G sub-pixel units, and the B sub-pixel units of the transparent display area and the conventional display area are arranged in respective rows.

Furthermore, the R sub-pixel units, the G sub-pixel units, and the B sub-pixel units of the transparent display area and the conventional display area are rectangular, circular, and square, respectively.

The present disclosure also provides a display device. The display device includes a display panel and a camera component. The display panel includes a transparent display area and a conventional display area surrounding the transparent display area, the transparent display area and the conventional display area both include a plurality of sub-pixel units, and a density of sub-pixel units in the transparent display area is the same as a density of sub-pixel units in the conventional display area. A pixel area of the sub-pixel units in the transparent display area is less than a pixel area of the sub-pixel units in the conventional display area. The camera component includes a camera corresponding to the transparent display area of the display panel.

Furthermore, a shape and a size of the transparent display area match a shape and a size of the camera.

Advantages of the present disclosure are as follows. A density of sub-pixel units in the transparent display area is the same as a density of sub-pixel units in the conventional display area, so that the transparent display area has a good display quality performance and good display uniformity of the entire display panel. A pixel area of the sub-pixel units in the transparent display area of the display panel of the present disclosure is less than a pixel area of the sub-pixel units in the conventional display area, so that an aperture ratio of metal of the transparent display area is reduced, thereby improving a light transmittance of the transparent display area. A size of the TFT circuit of one of the sub-pixel units in the transparent display area of the display panel of the present disclosure is less than a width of the first electrode thereof, or a portion beyond the first electrode of the TFT circuit is made of a transparent electrode material, thereby further improving the light transmittance of the transparent display area. The display panel of the present disclosure has the same sub-pixel density, thereby simplifying the fabrication of an FMM and improving an evaporation yield.

In the present disclosure, the camera component of the display device is disposed below the display panel, so a screen-to-body ratio is increased, which is beneficial to implement a full screen design. Moreover, the transparent display area has a high light transmittance, which can enhance the light capturing capability and the imaging quality performance of the camera component.

BRIEF DESCRIPTION OF DRAWINGS

To describe the technical solutions in the embodiments of the present disclosure more clearly, the following briefly describes the accompanying drawings required for describing the embodiments. Apparently, the accompanying drawings in the following description merely show some embodiments of the present disclosure, and persons of ordinary skill in the art can derive other drawings from these accompanying drawings without creative efforts.

DETAILED DESCRIPTION

The technical solutions according to the embodiments of the present disclosure are described clearly and completely in conjunction with accompanying drawings in the embodiments of the present disclosure. Apparently, the described embodiments are only a part rather than all the embodiments of the present disclosure. All other embodiments obtained by those skilled in the art without creative efforts based on the embodiments of the present disclosure fall within the protection scope of the present disclosure.

Figure 1:
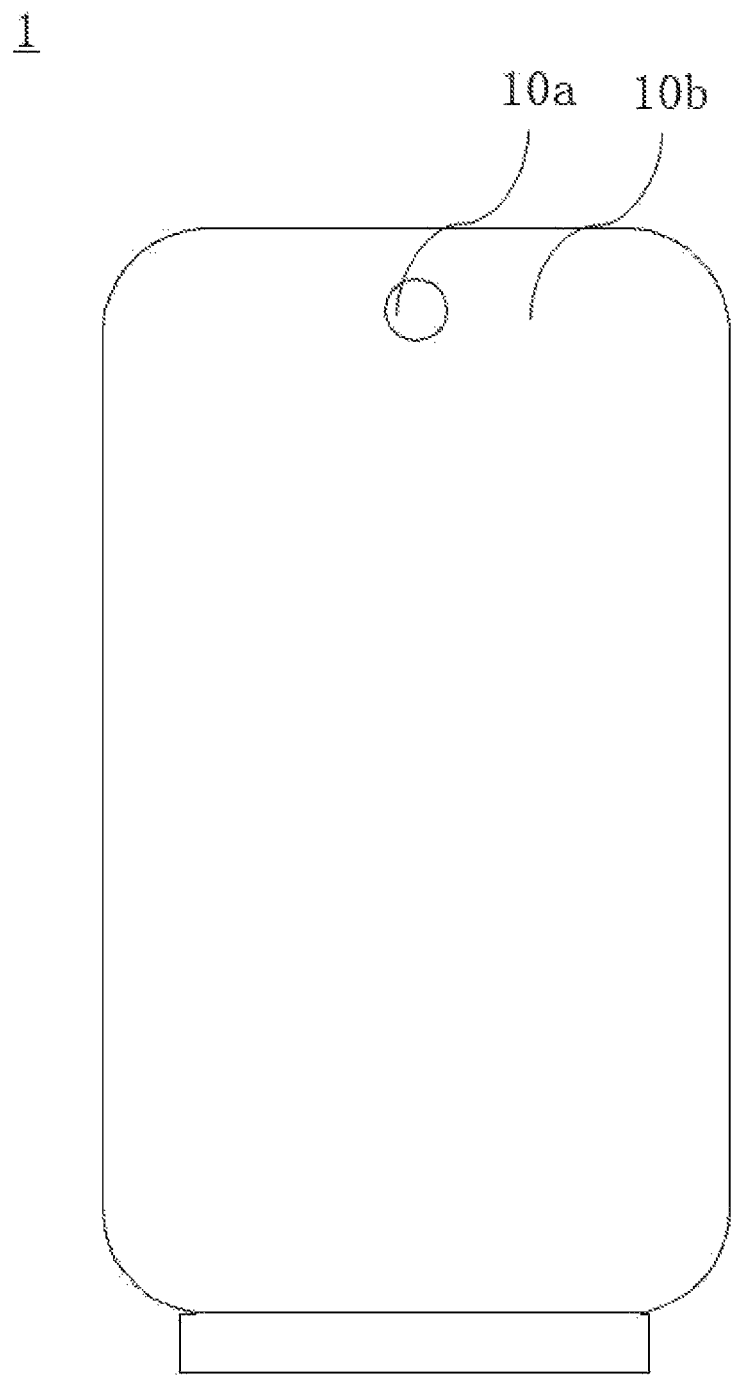
FIG. 1 is a top plan view of a display device of the present disclosure.
Figure 2:
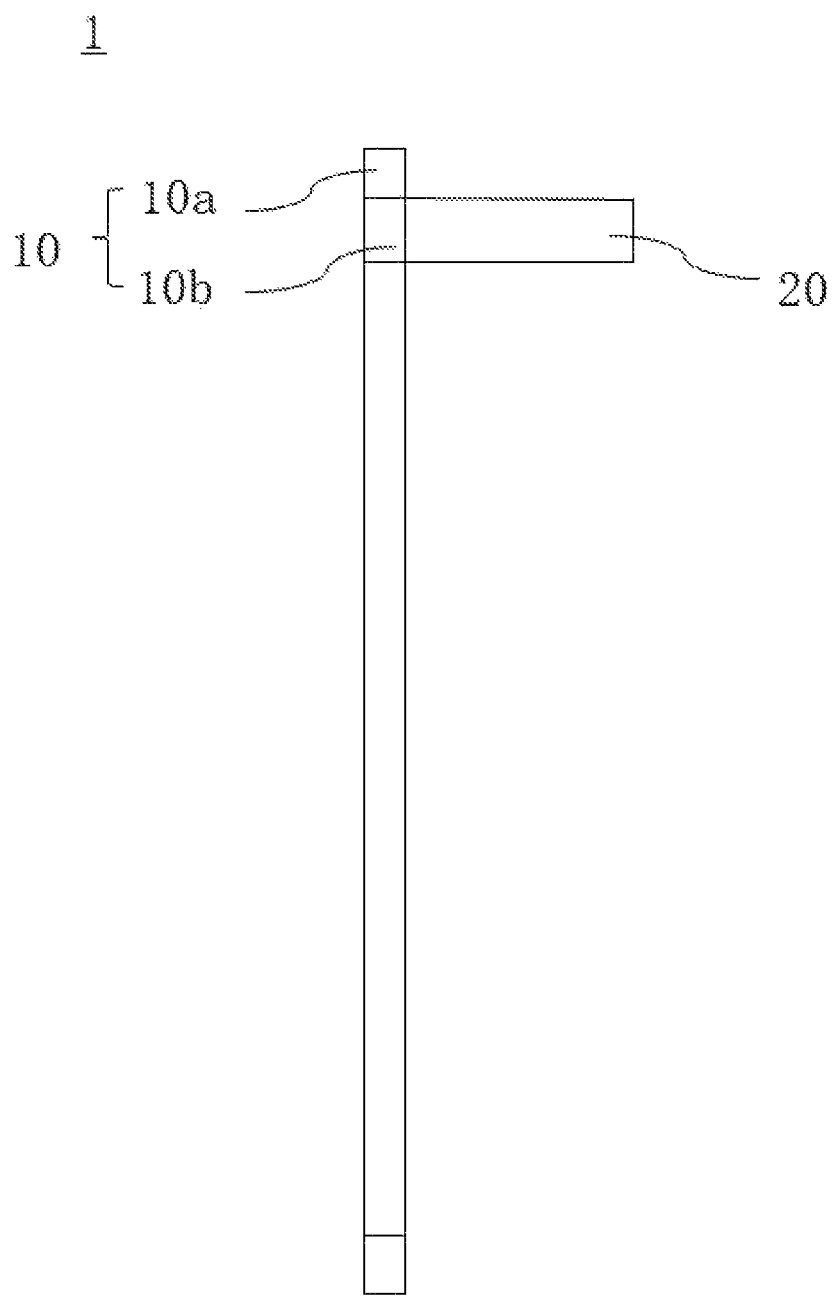
FIG. 2 is a schematic diagram of the display device of the present disclosure.

As shown in FIG. 1 and FIG. 2, the present disclosure provides a display panel 10 having a transparent display area 10a and a conventional display area 10b surrounding the transparent display area 10a.

Figure 3:
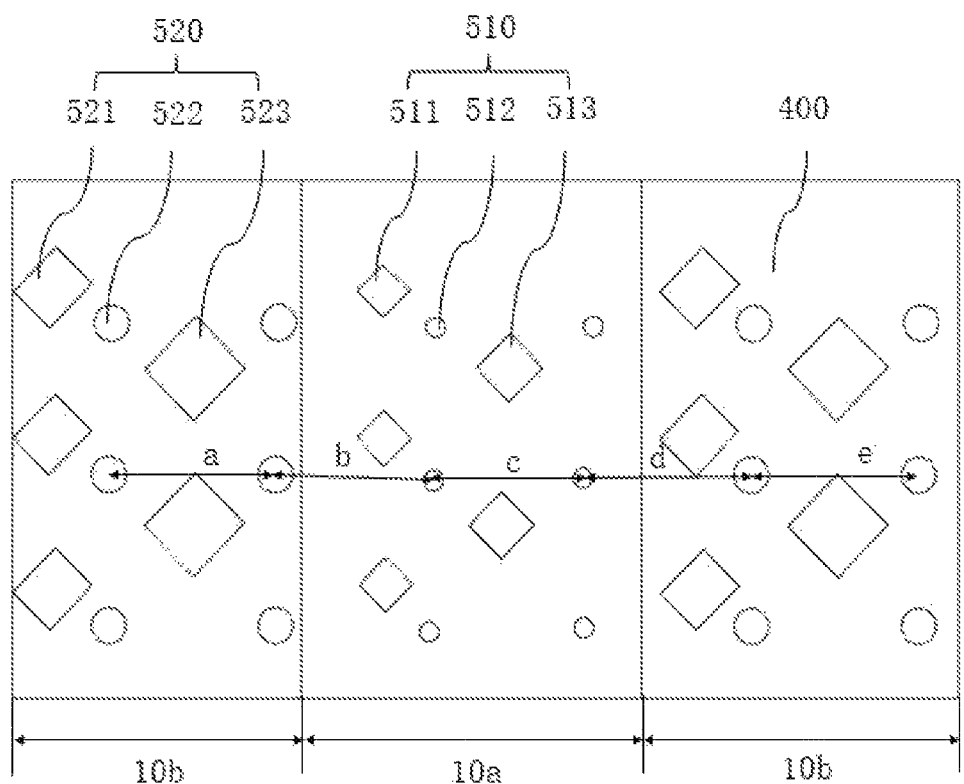
FIG. 3 is a partial schematic diagram of the display panel of the present disclosure.

Referring to FIG. 3, the transparent display area 10a includes a plurality of first sub-pixel units 510, and the conventional display area 10b includes a plurality of second sub-pixel units 520. A density of first sub-pixel units 510 in the transparent display area 10a is the same as a density of second sub-pixel units 520 in the conventional display area 10b. A pixel area of the sub-pixel units 500 in the transparent display area 10a is less than a pixel area of the sub-pixel units 500 in the conventional display area 10b. That is, the pixel area of the first sub-pixel units 510 is less than the pixel area of the second sub-pixel units 520.

The display quality performance of the display panel 10 is related to its density of the sub-pixel units and total pixel area. The total area of the pixels is the sum of the pixel areas of all the sub-pixel units. If the total area of the pixels is increased, the display resolution is improved. If the total area of the pixels is decreased, the light transmittance of the display panel 10 is improved. The density of the sub-pixel units is related to the uniformity and density of the distribution of the sub-pixel units.

In the display pane 110a of the present disclosure, the density of sub-pixel units in the transparent display area 10a is the same as the density of sub-pixel units in the conventional display area 10b, so that the pixel area of the sub-pixel units 500 in the transparent display area 10a is reduced, thereby reducing the total area of pixels in the transparent display area 10a, and reducing an aperture ratio of metal of the transparent display area 10a. Thus, the light transmittance of the transparent display area 10a is increased. Also, the density of sub-pixel units in the transparent display area 10a is the same as the density of sub-pixel units in the conventional display area 10b, so that the sub-pixel units 500 are evenly distributed, which ensures the uniformity of the display panel 10a and reduces the display difference of the display panel 10. In addition, the entire panel of the display panel 10 has the same density of sub-pixel units, thereby simplifying the fabrication of fine metal mask (FMM) and reducing the manufacturing difficulty and manufacturing cost of the display panel 10.

Please refer to FIG. 2, the display panel 10b includes a plurality of sub-pixel units 500. The sub-pixel units 500 include the first sub-pixel units 510 and the second sub-pixel units 520. The first sub-pixel units 510 include first red (R) sub-pixel units 511, first green (G) sub-pixel units 512, and first blue (B) sub-pixel units 513 which are arranged in respective rows. The second sub-pixel units 520 include second R sub-pixel units 521, second G sub-pixel units 522, and second B sub-pixel units 523 which are arranged in respective rows.

Please refer to FIG. 2, a spacing between two adjacent rows of the first G sub-pixel units 512 is c, a spacing between the second G sub-pixel unit 522 and the first G sub-pixel unit 512 is b, and a spacing between two adjacent rows of the second G sub-pixel units 522 is a, and a relationship between a, b, and c is: a=b=c.

That is, a pixel pitch of the G sub-pixel units of the display panel 10 is the same, and pixel densities of the G sub-pixel units of the display panel 10 are the same. Furthermore, a center distance between the R, G, B sub-pixel units in the transparent display area 10a and the conventional display area 10b can be adjusted to realize that the density of the sub-pixel units 500 in the transparent display area 10a is the same as the density of the sub-pixel units 500 in the conventional display area 10b.

Moreover, the pixel area of the first R sub-pixel units 511 is less than the pixel area of the second R sub-pixel units 521. The pixel area of the first G sub-pixel units 512 is less than the pixel area of the second G sub-pixel units 522. The pixel area of the first B sub-pixel units 513 is less than the pixel area of the second B sub-pixel units 523. Therefore, the total pixel area of the transparent display area 10a is less than the total pixel area of the conventional display area 10b. That is, if the pixel densities are the same, the pixel area of the sub-pixel units 500 of the partial display area is reduced, and the total pixel area of the partial display area can be reduced.

In this embodiment, the pitches of the sub-pixel units 500 of the display panel 10 are the same, and the pixel area of the first sub-pixel units 510 of the transparent display area 10a is reduced, so that the density of sub-pixels in the transparent display area 10a is the same as the density of sub-pixels in the conventional display area 10b, and the total pixel area of the transparent display area 10a is reduced. Therefore, in the transparent display area 10a of the display panel 10 of the embodiment, the sub-pixel density is constant, an aperture ratio is lowered, and the light transmittance is improved.

The total area of the transparent display area 10a is the sum of the total area of the pixels and a non-pixel area. In the case where the total area of the pixels is constant, by reducing the area occupied by wirings and components which have poor light transmittance in the non-pixel area of the transparent display area 10a or improving the light transmittance of wirings or components, the area of a high transmittance region in the transparent display area 10a can be increased, the light transmittance of the transparent display area 10a can be further improved, and the light capturing capability and the imaging quality performance of the camera component 20 can be further improved.

Figure 4:
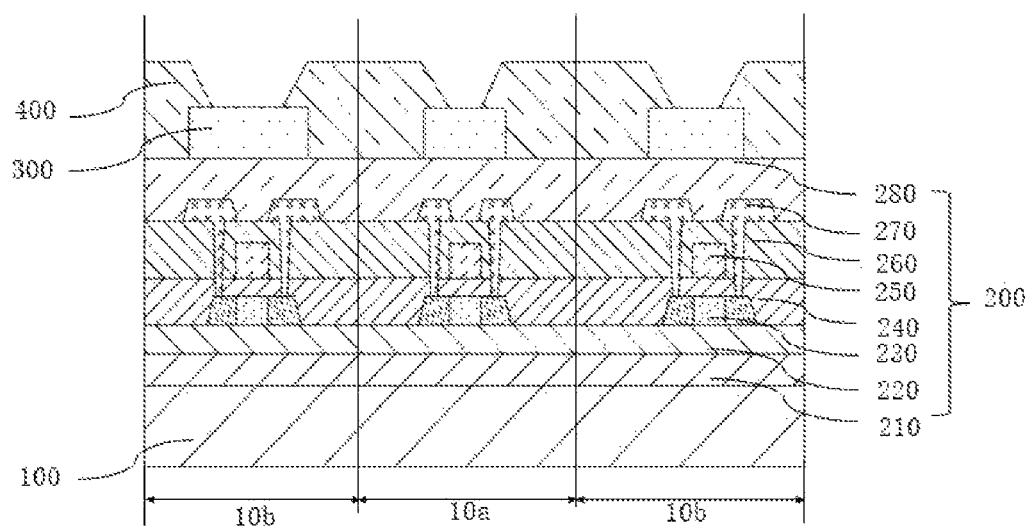
FIG. 4 is a schematic cross-sectional view of the display panel of the present disclosure.

Referring to FIG. 4, the display panel 10 includes a substrate 100, TFT circuits 200 disposed on the substrate, first electrodes 300 disposed on the TFT circuits 200, and a photo spacer layer 400 disposed on the first electrodes 300. Each the TFT circuit 200 includes a plurality of metal traces. The photo spacer layer 400 has a plurality of openings 410, one of the openings 410 correspondingly exposes one of the first electrodes 300. A width of one of the openings 410 in the transparent display area 10a is smaller than a width of one of the openings 410 in the convectional display area 10b.

Referring to FIG. 4, the TFT circuits 200 are configured to control each sub-pixel unit 500 to emit light, or are configured to control the amount of light emitted by each of the sub-pixel units 500.

In this embodiment, the TFT circuit 200 includes a first buffer layer 210, a second buffer layer 220, an active layer 230, a gate insulating layer 240, a gate 250, an interlayer metal dielectric layer 260, and a source/drain 270, and a planarization layer 280 layer, which are sequentially disposed on the substrate 100 in a direction away from the substrate 100.

Each the TFT circuit 200 includes metal traces. An orthographic projection of one of the first electrode 300 in the transparent display area 10a on the substrate 100 completely covers the TFT circuit 200. Alternatively, a portion of the metal traces of the TFT circuit 200 in the transparent display area 10a is made of a transparent electrode material. Alternatively, a portion of the metal traces of the TFT circuit 200 in the transparent display area 10a is made of a transparent electrode material, and the portion is beyond the first electrode 300. That is, the TFT circuit 200 can further improve the light transmittance of the transparent display area 10a by hiding its metal traces or using transparent traces made of the transparent electrode material.

Specifically, the transparent electrode material is selected from the group consisting of indium tin oxide (ITO) and indium gallium zinc oxide (IGZO). The ITO and the IGZO have good transparency and electrical conductivity. On the one hand, since the transparency of the ITO and the IGZO is good, it is possible to prevent the non-transparent trace from shielding the ambient light incident into the transparent display area 10a, thereby improving the transparency of the transparent display region 10a. On the other hand, since the conductivity of the ITO and the IGZO is good, the current can be quickly transmitted when the ITO and the IGZO serve as transparent traces. When an image is displayed, the driving TFT circuits of the pixels in the transparent display region 10a can quickly drive the pixels in the transparent display region 10a to emit light, thereby displaying a normal image.

Referring to FIG. 4, the first electrode 300 is disposed on a surface of the TFT circuit 200 facing away from the substrate 100, and the first electrode 300 and the TFT circuit 200 are electrically connected. In this embodiment, the first electrodes 300 are the sub-pixel electrodes.

In specific embodiments, the first electrodes 300 may serve as transparent electrodes (e.g., transflective electrodes), reflective electrodes, or metal electrodes.

If the first electrode 300 serves as the transparent electrode (e.g., transflective electrode), it may be made of a transparent electrode material being select from the group consisting of indium tin oxide (ITO), indium zinc oxide (IZO), zinc oxide (ZnO), indium oxide ($In_2O_3$), indium gallium oxide (IGO), and aluminum zinc oxide (AZO).

If the first electrode 300 serves as the reflective electrode, the reflective electrode may be formed by a reflective layer and an auxiliary layer which are stacked. The reflective layer may be made of material being select from the group consisting of silver (Ag), magnesium (Mg), aluminum (Al), platinum (Pt), palladium (Pd), gold (Au), nickel (Ni), niobium (Nd), antimony (Ir), and chromium (Cr). The auxiliary layer may be made of a transparent electrode material being select from the group consisting of indium tin oxide (ITO), indium zinc oxide (IZO), zinc oxide (ZnO), and indium oxide ($In_2O_3$). The structure and material of the first electrodes 300 are not limited thereto and may modify.

If the first electrode 300 serves as the metal electrode, it may be made of a metal electrode material being select from the group consisting of silver (Ag), magnesium (Mg), aluminum (Al), platinum (Pt), palladium (Pd), gold (Au), nickel (Ni), niobium (Nd), antimony (Ir), and chromium (Cr).

If the first electrode 300 serves as the reflective electrode and the metal electrode, the first electrode 300 can shield or reflect light, thereby preventing light emitted by the display panel 10 or ambient light from transmitting into the active layer 230, and protecting the active layer 230.

Referring to FIG. 4, the photo spacer layer 400 is formed on surfaces of the first electrodes 300 facing away from the substrate 100. The photo spacer layer 400 has a plurality of openings 410. One of the openings 410 correspondingly expose one of the first electrodes 300. The photo spacer layer 400 is configured to define sub-pixels by openings 410 corresponding to each first electrodes 300 (i.e., exposing central portions of openings of the first electrodes 300). In addition, the photo spacer layer 400 can support a fine metal mask for an evaporation process to prevent the fine metal mask from being recessed and damaged during the evaporation process.

In specific embodiments, the photo spacer layer 400 may be made of a suitable organic material, such as polyacrylate and polyimide, and may be formed as a single material layer or a composite material layer including a suitable inorganic material. In an actual process, the photo spacer layer 400 is formed on the entire surfaces of the first electrodes 300 and the layer where the first electrodes 300 are located by using material such as polyacrylate or polyimide. Then, the photo spacer layer 400 is patterned to form the plurality of openings 410 to expose centers of the first electrodes 300.

That is, the photo spacer layer 400 defines the shape or size of each sub-pixel by etching different patterns. For example, in the embodiment, the photo spacer layer 400 defines the R, G, and B sub-pixels as a rectangle, a square, and a circle, respectively. Also, by adjusting the sizes of the openings in the transparent display area 10a, the area of the first sub-pixels 510 can be reduced.

The display panel 10 further includes an organic light-emitting layer disposed on the first electrodes 300 and second electrodes disposed on the organic light-emitting layer.

One of the first electrode, the organic light-emitting layer, and the second electrode form an organic light-emitting unit, and the organic light-emitting layer can be configured to emit light by applying a voltage between the first electrode 300 and the second electrode based on an electroluminescent principle.

The organic light-emitting layer covers on the first electrode 300. Specifically, the organic light-emitting layer is evaporated in the openings 410. The organic light-emitting layer is composed of a light-emitting material layer. The light-emitting material layer includes one or more of a red light-emitting material layer, a green light-emitting material layer, a blue light-emitting material layer, or a white light-emitting material layer. Common light-emitting materials include small molecule light-emitting materials, polymeric light-emitting materials, and tree type light-emitting materials. Generally, the small molecule light-emitting materials are often subjected to a vacuum evaporation process, the polymer light-emitting materials are often subjected to spin coating or inkjet processes, and the tree type light-emitting materials may be subjected to the above processes according to the molecular weight.

A layer of the second electrodes is located on a surface of the organic light-emitting layer opposite to the first electrodes 300. The light emitted by the organic light-emitting layer passes through the layer of the second electrodes. In this embodiment, the second electrode is a cathode.

In specific embodiments, the layer of the second electrodes may be made of a transparent electrode material (such as indium tin oxide (ITO), indium zinc oxide (IZO), zinc oxide (ZnO), or indium oxide ($In_2O_3$)) or made of a metal electrode material (such as aluminum (Al), silver (Ag), or lithium (Li)).

In specific embodiments, the organic light-emitting unit further includes at least one organic layer, the organic layer is a hole injection layer (HIM), a hole transport layer (HTM), an electron injection layer (EIL) or an electron transport layer (ETL).

Referring to FIG. 4, the substrate 100 is transparent or has a high light transmittance in a visible light band. Specifically, the substrate 100 may be made of a glass material, quartz, metal material, or a plastic material such as polyethylene terephthalate (PET), polyethylene naphthalate (PEN) or polyimide.

In this embodiment, the substrate 110 is a flexible substrate, and the flexible substrate can adopt a PI substrate with better resistance against bending force and high light transmittance.

Referring to FIG. 4, the first buffer layer 210 and the second buffer layer 220 are sequentially disposed on the substrate 100. The first buffer layer 210 or the second buffer layer 220 may made of a suitable material such as PET, PEN, polyacrylate, and/or polyimide to form a layered structure in a single layer or a multilayer. The first buffer layer 210 or the second buffer layer 220 may also be made of silicon oxide or silicon nitride, or may include a composite layer of an organic material and/or an inorganic material. The first buffer layer 210 or the second buffer layer 220 may be formed on the entire surface of the substrate 100 or may be patterned.

Referring to FIG. 4, the active layer 230 is disposed on a surface of the second buffer layer 220 facing away from the substrate 100, and a channel region is formed on the active layer 230. In a specific embodiment, the active layer 230 may be formed of an amorphous silicon layer, a silicon oxide layer, metal oxide, a polysilicon layer, or an organic semiconductor material.

In this embodiment, the active layer 230 is formed by forming polysilicon from amorphous silicon and then performing an ion doping process. The ion doping process includes doping two ends of the polysilicon into an N-type, and then heavily doping the N-type to enhance conductivity.

Referring to FIG. 4, the gate insulating layer (GI) 240 is located on a surface of the active layer 230 that faces away from the substrate 100. Material of the gate insulating layer 240 includes one or more of silicon oxide (SiOx) or silicon nitride (SiNx).

Referring to FIG. 4, the gate 250 is disposed on a surface of the gate insulating layer 240 facing away from the substrate 100. In this embodiment, the gate 250 is disposed above the channel region of the active layer 230. It should be understood that the gate 250 may have various arrangements, such as a bottom gate type, a top gate type, or a double gate type, and the present disclosure is not limited thereto.

Referring to FIG. 4, an interlayer dielectric layer (ILD) 260 is formed on the gate 250, and the interlayer dielectric layer 260 is configured to insulate the active layer 230, the gate 240, and the first electrodes 300. Moreover, a first via hole and a second via hole are respectively disposed on two sides of the channel region of the active layer 230.

In specific embodiments, the ILD layer 260 is a composite layer of SiOx with SiOx, SiNx, or SiNx. In an actual process, the interlayer dielectric layer (ILD) 260 is deposited by a plasma enhanced chemical vapor deposition process.

Referring to FIG. 4, a source and a drain 270 are formed on the interface dielectric layer 260. The source and the drain 270 extend through the interlayer dielectric layer 270 through the first via hole and the second via hole, respectively, and are respectively connected to the doped region of the active layer 230.

In view of conductivity, the source and the drain 270 may be made of material, such as aluminum (Al), platinum (Pt), palladium (Pd), silver (Ag), magnesium (Mg), gold (Au), nickel (Ni), niobium (Nd), iridium (Ir), chromium (Cr), lithium (Li), calcium (Ca), molybdenum (Mo), titanium (Ti), tungsten (W), copper (Cu), or other suitable alloy, and may be formed as a single material layer or a composite material layer.

Referring to FIG. 4, a planarization layer (PLN) 280 is formed on a layer of the source and the drain layer. In this embodiment, the planarization layer 270 is made of a transparent material to improve the light transmittance of the transparent display area 10a. Those skilled in the art can understand that the planarization layer 280 can also be made of an opaque material for serving as a black matrix (BM).

As shown in FIG. 1 and FIG. 2, the present disclosure further provides a display device 1. The display device 1 includes a display panel 10 and a camera component 20 which are stacked one on another. The display device 1 uses the display panel 10 of the present disclosure, and the camera component 20 has a camera. The camera corresponds to the transparent display area 10a of the display panel 10. Also, a shape and a size of the transparent display area 10a match those of the camera.

In this embodiment, the shape of the transparent display area 10a is a closed circle. In a specific embodiment, the shapes and sizes of the transparent display area 10a and the camera in the display device 1 may be modified according to actual design requirements, and the present disclosure does not limit this.

In the display device 1 of this embodiment of the present disclosure, the transparent display area 10a does not emit light when shooting. Meanwhile, an imaging light signal of a subject (i.e., a diffuse light signal thereof) sequentially travels through the display panel 10 into the camera of the camera component 20 to obtain a captured image of the subject. When not shooting, the camera component 20 is in a non-operating state, the organic light-emitting unit of the transparent display area 10a emits light, and the light emitted by the organic light-emitting layer is emitted out for display.

In the display device 1 of the present disclosure, the camera component 20 is disposed under the display panel 10, which can improve the screen-to-body ratio and is advantageous for implementing a full screen design. In the present disclosure, the light transmittance of the transparent display area 10a of the display device 1 is high, and the amount of incident light of the camera component 20 is increased, and the imaging quality of the camera component 20 is better. The density of sub-pixels of the entire display panel 10 of the display device 1 is uniform, so that it simplifies the difficulty of FMM production, improves a yield of the vapor deposition process, and reduces the manufacturing cost and the manufacturing difficulty of the display device 1.

The above descriptions are only the preferred embodiments of the present disclosure, it should be pointed out that, to those ordinarily skilled in the art, several modifications and variations can be made without departing from the principle of the present disclosure, also those modifications and variations should be considered as the protection scope of the present disclosure.

The subject matter of the present disclosure can be manufactured and used in the industry with industrial applicability.

What is claimed is:

1. A display panel, comprising a transparent display area and a conventional display area surrounding the transparent display area, wherein the transparent display area and the conventional display area both comprise a plurality of sub-pixel units, and a density of sub-pixel units in the transparent display area is the same as a density of sub-pixel units in the conventional display area;
   wherein a pixel area of the sub-pixel units in the transparent display area is less than a pixel area of the sub-pixel units in the conventional display area;
   wherein the display panel comprises a substrate, a thin film transistor (TFT) circuit, a plurality of sub-pixel electrodes, and a photo spacer layer, wherein the TFT circuit, the sub-pixel electrodes, and the photo spacer layer are sequentially disposed on the substrate;
   wherein the TFT circuit comprises a plurality of metal traces;
   wherein the photo spacer layer comprises a plurality of openings, and one of the openings correspondingly exposes one of the sub-pixel electrodes; and
   wherein a width of one of the openings of the photo spacer layer in the transparent display area is less than a width of one of the openings of the photo spacer layer in the conventional display area.

2. The display panel as claimed in claim 1, wherein an orthographic projection of a first electrode in the transparent display area on the substrate completely covers the TFT circuit.

3. The display panel as claimed in claim 1, wherein a portion of the metal traces of the TFT circuit in the transparent display area is made of a transparent electrode material, and the portion is beyond a first electrode.

4. The display panel as claimed in claim 1, wherein the width of the one of the openings of the photo spacer layer in the transparent display area is 0.5 to 0.8 times the width of the one of the openings of the photo spacer layer in the conventional display area.

5. A display panel, comprising a transparent display area and a conventional display area surrounding the transparent display area, wherein the transparent display area and the conventional display area both comprise a plurality of sub-pixel units, and a density of sub-pixel units in the transparent display area is the same as a density of sub-pixel units in the conventional display area; and wherein a pixel area of the sub-pixel units in the transparent display area is less than a pixel area of the sub-pixel units in the conventional display area.

6. The display panel as claimed in claim 5, wherein the display panel comprises a substrate, a thin film transistor (TFT) circuit, a plurality of first electrodes, and a photo spacer layer, wherein the TFT circuit, the first electrodes, and the photo spacer layer are sequentially disposed on the substrate, and the TFT circuit comprises a plurality of metal traces.

7. The display panel as claimed in claim 6, wherein the photo spacer layer comprises a plurality of openings, and one of the openings correspondingly exposes one of the first electrodes.

8. The display panel as claimed in claim 7, wherein the photo spacer layer is composed of one or more layers of polyacrylate and polyimide.

9. The display panel as claimed in claim 7, wherein a width of one of the openings of the photo spacer layer in the transparent display area is less than a width of one of the openings of the photo spacer layer in the conventional display area.

10. The display panel as claimed in claim 6, wherein the width of the one of the openings of the photo spacer layer in the transparent display area is 0.5 to 0.8 times the width of the one of the openings of the photo spacer layer in the conventional display area.

11. The display panel as claimed in claim 6, wherein an orthographic projection of one of the first electrodes in the transparent display area on the substrate completely covers the TFT circuit.

12. The display panel as claimed in claim 6, wherein a portion of the metal traces of the TFT circuit in the transparent display area is made of a transparent electrode material.

13. The display panel as claimed in claim 6, wherein a portion of the metal traces of the TFT circuit in the transparent display area is made of a transparent electrode material, and the portion is beyond one of the first electrodes.

14. The display panel as claimed in claim 6, wherein the first electrodes are a plurality of sub-pixel electrodes.

15. The display panel as claimed in claim 6, wherein the TFT circuit comprises a first buffer layer, a second buffer layer, an active layer, a gate insulating layer, a gate, an interlayer dielectric layer, a source, a drain, and a planarization layer which are sequentially disposed on the substrate.

16. The display panel as claimed in claim 5, wherein the transparent display area and the conventional display area both comprise one or more of red (R) sub-pixel units, green (G) sub-pixel units, and blue (B) sub-pixel units.

17. The display panel as claimed in claim 16, wherein the R sub-pixel units, the G sub-pixel units, and the B sub-pixel units of the transparent display area and the conventional display area are arranged in respective rows.

18. The display panel as claimed in claim 16, wherein the R sub-pixel units, the G sub-pixel units, and the B sub-pixel units of the transparent display area and the conventional display area are rectangular, circular, and square, respectively.

19. A display device, comprising a display panel and a camera component, wherein the display panel comprises a transparent display area and a conventional display area surrounding the transparent display area, the transparent display area and the conventional display area both comprise a plurality of sub-pixel units, and a density of sub-pixel units in the transparent display area is the same as a density of sub-pixel units in the conventional display area;

wherein a pixel area of the sub-pixel units in the transparent display area is less than a pixel area of the sub-pixel units in the conventional display area; and wherein the camera component comprises a camera corresponding to the transparent display area of the display panel.

20. The display device as claimed in claim 19, wherein a shape and a size of the transparent display area match a shape and a size of the camera.

* * * * *